US 8,570,466 B2

(12) United States Patent
Choi et al.

(10) Patent No.: US 8,570,466 B2
(45) Date of Patent: Oct. 29, 2013

(54) TRANSFLECTIVE LIQUID CRYSTAL DISPLAY DEVICE HAVING A THIN FILM TRANSISTOR AND MANUFACTURING METHOD THEREOF

(75) Inventors: Myung-Wook Choi, Yongin (KR); Sang-Woo Park, Yongin (KR); Sung-Wook Kim, Yongin (KR); Dae-Seung Yun, Yongin (KR); Eun-Young Lee, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 324 days.

(21) Appl. No.: 12/980,797

(22) Filed: Dec. 29, 2010

(65) Prior Publication Data
US 2011/0261305 A1  Oct. 27, 2011

(30) Foreign Application Priority Data
Apr. 26, 2010  (KR) .................. 10-2010-0038586

(51) Int. Cl.
*G02F 1/1335* (2006.01)
(52) U.S. Cl.
USPC ............ 349/114; 349/33; 349/41; 349/42; 349/84; 349/113
(58) Field of Classification Search
USPC .............. 349/19, 33, 41, 42, 84, 113, 114
See application file for complete search history.

(56) References Cited

U.S. PATENT DOCUMENTS 7,697,094 B2 * 4/2010 Yang et al. .............. 349/114
2007/0153174 A1 * 7/2007 Kim ..................... 349/114

FOREIGN PATENT DOCUMENTS

KR  10-2004-0062101  7/2004
KR  10-2007-0002619  1/2007

* cited by examiner

*Primary Examiner* — Jennifer Doan
(74) *Attorney, Agent, or Firm* — Knobbe, Martens, Olson & Bear LLP

(57) ABSTRACT

There are provided a thin film transistor substrate for transflective liquid crystal display device (LCD) and a manufacturing method thereof, which can reduce manufacturing cost and simplifying manufacturing processes. In the method, a thin film transistor is formed on a reflection region of a device substrate defined by the reflection region and a transmission region. A passivation layer is formed on the thin film transistor so as to expose a drain electrode of the thin film transistor and to cover the thin film transistor. A pixel electrode is formed on the transmission and reflection regions. The pixel electrode has a structure of a first pixel electrode electrically connected to the drain electrode and a second pixel electrode formed to have an embossed pattern on the first pixel electrode. A reflective layer is formed on the second electrode pixel having the embossed pattern on the reflection region.

8 Claims, 5 Drawing Sheets

TRANSFLECTIVE LIQUID CRYSTAL DISPLAY DEVICE HAVING A THIN FILM TRANSISTOR AND MANUFACTURING METHOD THEREOF

CROSS-REFERENCE TO RELATED APPLICATION

This application claims the benefit of Korean Patent Application No. 10-2010-0038586, filed Apr. 26, 2010, in the Korean Intellectual Property Office, the disclosure of which is incorporated herein by reference.

BACKGROUND

1. Field

Aspects of the present invention relate to a transflective liquid crystal display device (LCD) having a thin film transistor and a manufacturing method thereof. More particularly, aspects of the present invention relate to a transflective LCD having a thin film transistor and a manufacturing method thereof, which can reduce manufacturing cost and improve the reliability of a display device.

2. Description of the Related Art

As demands on various types of display devices have recently increased with the development of information society, research on flat panel display devices, such as a liquid crystal display device (LCD), a plasma display panel (PDP), a field emission display device (FED), an electrophoretic display device (EPD) and an organic light emitting display device (OLED) have increased. Among these display devices, the LCD, using the translucency of liquid crystals, is a device that is not self-luminescent. Therefore, LCDs may be generally classified as a transmissive LCD that displays images using a built-in light source such as a backlight, and a reflective LCD that displays images using external incident light such as natural light.

The transmissive LCD has a backlight unit mounted on the rear thereof, and the backlight unit itself is used as a light source. Hence, the transmissive LCD has a screen having a high luminance. However, the transmissive LCD is not well suited to be used in portable devices, and the like, due to its large power consumption. On the other hand, in the reflective LCD, natural light incident from an exterior of the reflective LCD is selectively transmitted through the switching operation of a liquid crystal layer and again reflected from a reflective layer so as to be emitted towards a front of the reflective LCD, thereby displaying images. Since the reflective LCD itself has no light source, its luminance is low, and it is difficult to use the reflective LCD in a dark place.

Recently, a transflective LCD has been developed to overcome disadvantages of the transmissive and reflective LCDs. In the transflective LCD, a reflective layer is formed to reflect light incident from the exterior of the transflective LCD or light from a backlight unit is transmitted through a transmissive window, thereby displaying images. However, since a number of processes and masks, used to manufacture in the transflective LCD, is increased, manufacturing cost is increased, and a manufacturing process is complicated. Also, as the manufacturing process is complicated, productivity, or manufacturing yield, is deteriorated.

SUMMARY

Aspects of the present invention provide a transflective liquid crystal display (LCD) device having a thin film transistor, which can reduce manufacturing cost and simplify manufacturing processes.

Aspects of the present invention provide a manufacturing method of the transflective LCD device having the thin film transistor.

Aspects of the present invention provide a transflective LCD device having a thin film transistor, including: a device substrate having a reflection region and a transmission region; the thin film transistor formed on the reflection region of the device substrate and having a drain electrode; a passivation layer formed on the thin film transistor and exposing the drain electrode; a pixel electrode formed in a stacked structure including: a first pixel electrode electrically connected to the drain electrode; and a second pixel electrode formed to have an embossed pattern on the first pixel electrode; and a reflective layer formed on the second pixel electrode and formed in the reflection region of the device substrate.

According aspects of the present invention, there is provided a manufacturing method of a transflective LCD device having a thin film transistor, the method including: forming the thin film transistor on a reflection region of a device substrate having the reflection region and a transmission region; forming a passivation layer on the thin film transistor so as to expose a drain electrode of the thin film transistor and to cover the thin film transistor; forming a pixel electrode on the transmission region and the reflection region of the device substrate, the forming of the pixel electrode including: forming a first pixel electrode electrically connected to the drain electrode; and forming a second pixel electrode, having an embossed pattern, on the first pixel electrode; and forming a reflective layer on the second electrode pixel having the embossed pattern, the reflective layer being disposed on the reflection region of the device substrate.

According to another aspect of the present invention, the forming of the pixel electrode on the transmission region and the reflection region may include forming a first pixel electrode on the device substrate having the passivation layer; forming a second pixel electrode on the first pixel electrode; and performing a spray type etching process on the second pixel electrode to form the embossed pattern at the second pixel electrode.

According to another aspect of the present invention, diluted hydro-fluoride (HF) obtained by mixing HF and distilled (DI) water at a ratio of 1:400 may be used as an etchant in the etching process.

According to another aspect of the present invention, the second pixel electrode may be formed of a transparent conductive material, and an etch rate of the second pixel electrode is higher than an etch rate of the first pixel electrode. The first pixel electrode may be formed of indium tin oxide (ITO), tin oxide (TO) or indium zinc oxide (IZO), and the second pixel electrode may be formed of zinc oxide (ZnO) or ZnO alloy.

According to another aspect of the present invention, the embossed pattern may have a round shape. The surface of the reflective layer may have round concave and convex portions that correspond to a lower part of the embossed pattern.

According to another aspect of the present invention, the reflective layer may be formed of an opaque conductive material. The passivation layer may be formed of an inorganic insulating material.

According to another aspect of the present invention, a thickness of the second pixel electrode may be greater than a thickness of the first pixel electrode. The reflective layer may be formed on the thin film transistor.

According to aspects of the present invention, since the formation of an organic insulating layer is omitted, the stacking, photolithography and masking processes of the organic insulating layer are not performed. Thus, a manufacturing cost can be reduced, and manufacturing processes are simplified, thereby enhancing productivity and increasing manufacturing yield. Also, a reflective layer is formed on a pixel electrode, wherein the reflective layer is not formed of an organic insulating layer, but rather, the reflective layer is formed of a conductive material, so as to prevent the reflective layer from being exfoliated, thereby enhancing the reliability of products, and the like.

According to aspects of the present invention, a reflection of light can be increased by forming a pixel electrode and a reflective layer so that both have round embossed patterns. Moreover, ZnO alloy is used as the pixel electrode, thereby increasing the reflexibility of light. Also, a pixel electrode having an embossed pattern is formed up to a transmission region, so that the diffusion of light from a backlight unit disposed below a substrate is induced, thereby enhancing luminance.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
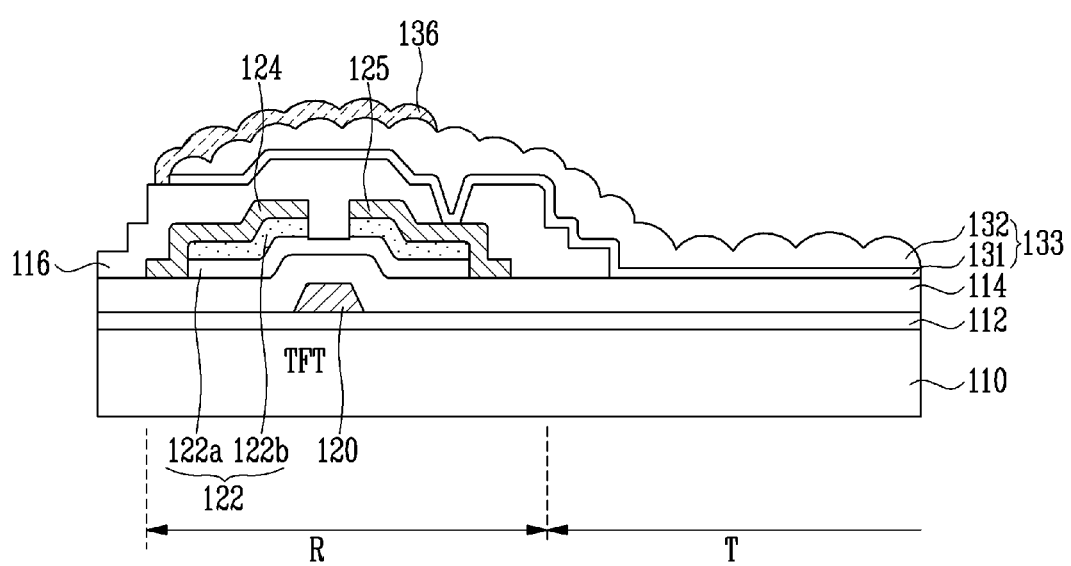
FIG. 1 is a sectional view showing a transflective liquid crystal display (LCD) device having a thin film transistor according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

As referred to herein, when a first element is said to be disposed or formed "on", or "adjacent to", a second element, the first element can directly contact the second element, or can be separated from the second element by one or more other elements located therebetween. In contrast, when an element is referred to as being disposed or formed "directly on" another element, there are no intervening elements present.

FIG. 1 is a sectional view showing a transflective liquid crystal display (LCD) device having a thin film transistor according to an embodiment of the present invention. For convenience of illustration, the thin film transistor having one sub-pixel defined thereon will be shown in the embodiment shown in FIG. 1.

Referring to FIG. 1, the transflective LCD having the thin film transistor includes a device substrate 110 having a reflection region R and a transmission region T, and a thin film transistor TFT formed on the reflection region R of the device substrate 110. The transflective LCD device having the thin film transistor further includes a pixel electrode 133 formed on the reflection and transmission regions R and T of the device substrate 110, and a reflective layer 136 formed on the thin film transistor TFT. The device substrate 110 includes an insulated glass, plastic or conductive substrate. A buffer layer 112 to prevent etch damage of the device substrate 110 is formed on a front surface of the device substrate 110.

In the present embodiment, the reflection region R of the device substrate 110 is not defined as a region in which the thin film transistor TFT is formed. Rather, the device substrate 110 is defined as a region having the reflective layer 136. The transmission region T is defined as a region having the reflective layer 136. The thin film transistor TFT includes a gate electrode 120, and a gate insulating layer 114 formed on the gate electrode 120 and the device substrate 110. The thin film transistor TFT further includes an active layer 122 partially overlapped with the gate electrode 120, with the gate insulating layer 114 interposed therebetween, so as to form a channel and also includes a source electrode 124 and a drain electrode 125, both formed on the active layer 122.

The active layer 122 includes a semiconductor layer 122a formed to be spaced apart from the gate electrode 120, and an ohmic contact layer 122b formed on the semiconductor layer 122a. The gate insulating layer 114 is disposed between the semiconductor layer 122a and the gate electrode 120. The thin film transistor TFT, including the aforementioned components, is formed on the transmission region T of the device substrate 110. Therefore, the thin film transistor TFT controls a turn-on or a turn-off of a voltage in a pixel.

A passivation layer 116 is formed on the reflection region R of the device substrate 110. The passivation layer 116 covers the thin film transistor TFT and allows the drain electrode 125 of the thin film transistor TFT to be exposed through the passivation layer 116. The passivation layer 116 is formed of an inorganic insulating material in a single- or multiple-layer structure. The inorganic insulation material includes SiOx, SiNx, SiONx. However, aspects of the present invention are not limited thereto, and the passivation layer 116 may be formed in other suitable structures and formed of other suitable materials.

The pixel electrode 133 is formed on the transmission and reflection regions T and R in a sub-pixel region of the device substrate 110. The pixel electrode 133 is electrically connected to the drain electrode 125 of the thin film transistor TFT so that an electric field is formed in the pixel. The pixel electrode, according to the present embodiment, has a stacked structure having a first pixel electrode 131 and a second pixel electrode 132 that is formed on the first pixel electrode 131. The first and second pixel electrodes 131 and 132 are formed of a transparent conductive material. At this time, the second pixel electrode 132 is formed of a transparent conductive material, and an etch rate of the second pixel electrode is higher than an etch rate of the first pixel electrode 131.

Indium tin oxide (ITO) or indium zinc oxide (IZO) is used as the transparent conductive material of the first pixel electrode 131. Zinc oxide (ZnO) or ZnO alloy is used as the transparent conductive material of the second pixel electrode 132. Aluminum zinc oxide (AlZnO) is used as the ZnO alloy. When the ZnO alloy is used as the second pixel electrode 132, an amount of reflected external light can be increased by a metallic component of the ZnO alloy in the transmission region T. The second pixel electrode 132 is formed to have a round embossed pattern so that the reflexibility of light can be more increased as compared with a square embossed pattern.

Moreover, in the present embodiment there exists a difference in cell gap generated by omitting an organic insulating layer, which is generally used. However, the second pixel electrode 132 having the embossed pattern is formed to extend up to the transmission region T. Accordingly, diffusion of light from a backlight unit (not shown) disposed below the device substrate 110 is induced, thereby enhancing luminance. Meanwhile, a thickness of the second pixel electrode 132 is formed greater than a thickness of the first pixel electrode 131.

The reflective layer 136 is formed on the second pixel electrode 132, which is formed above the thin film transistor TFT. The reflective layer 136 allows natural light incident from an exterior to be reflected and diffused so that the natural light is radiated to a front of the thin film transistor substrate. The surface of the reflective layer 136 has round concave and convex portions, which correspond to a shape of the second pixel electrode 132 having the embossed pattern. The reflective layer 136 has round concave and convex portions so that the reflection of light can be further increased as compared with a square embossed pattern, thereby enhancing luminance. The reflective layer 136 is formed of an opaque conductive material including at least one of Ag, Al, Au and alloy thereof.

When a reflective layer is formed on an insulating layer made of an organic insulating material, adhesion between the organic insulating layer and the reflective layer is deteriorated, and therefore, the reflective layer may become exfoliated. However, in the present embodiment, the reflective layer 136 is formed on the second pixel electrode 132, which is made of a conductive material. As a result, adhesion between the reflective layer 136 and the second pixel electrode 132 is improved. Thus, it is possible to prevent the reflective layer 136 from being exfoliated, thereby enhancing a reliability of the thin film transistor and the transreflective LCD having the thin film transistor.

Figure 2A:
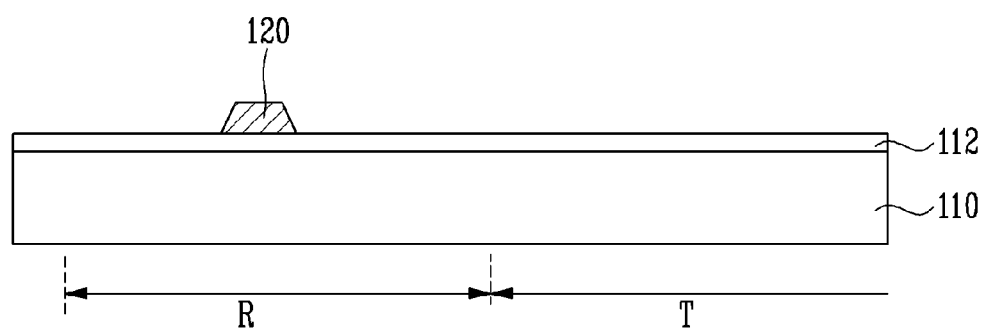
FIGS. 2A to 2H are sectional views illustrating a manufacturing method of the transflective LCD device having the thin film transistor, shown in FIG. 1, according to an embodiment of the present invention.

Hereinafter, a manufacturing method of a display device according to an embodiment of the present invention will be described with reference to FIGS. 2A to 2H. FIGS. 2A to 2H are sectional views illustrating a manufacturing method of the transflective LCD device having the thin film transistor of FIG. 1, according to an embodiment of the present invention. Referring to FIG. 2A, a first conductive material, constituting the gate electrode, is formed on a device substrate 110. The device substrate 110 includes a reflection region R and a transmission region T. A gate electrode 120 is then formed on the reflection region R of the device substrate 110 through photolithography and etching processes.

The first conductive material constituting the gate electrode 120 includes a single layer of a metallic material such as Mo, Ti, Cu, Ta, AlNd, Al, Cr, Mo alloy, Cu alloy or Al alloy. However, aspects of the present invention are not limited thereto, and the first conductive material constituting the gate electrode 120 may include a stacked structure of two or more layers such as Al/Cr, Al/Mo, Al(Nd)/Al, Al(Nd)/Cr, Mo/Al(Nd)/Mo, Cu/Mo, Ti/Al(Nd)/Ti, Mo/Al, Mo/Ti/Al(Nd), Cu alloy/Mo, Cu alloy/Al, Cu alloy/Mo alloy, Cu alloy/Al alloy, Al/Mo alloy, Mo alloy/Al, Al alloy/Mo alloy, Mo alloy/Al alloy or Mo/Al alloy.

Also, a buffer layer 112 to preventing etch damage of the device substrate 110 may be further formed before the gate electrode 120 is formed. The buffer layer 112 is formed of an insulating material, such as a silicon nitride or silicon oxide, on the device substrate 110. The buffer layer 112 may prevent a foreign matter from permeating into a thin film transistor in subsequent processes of the manufacturing of the thin film transistor TFT.

Figure 2B:
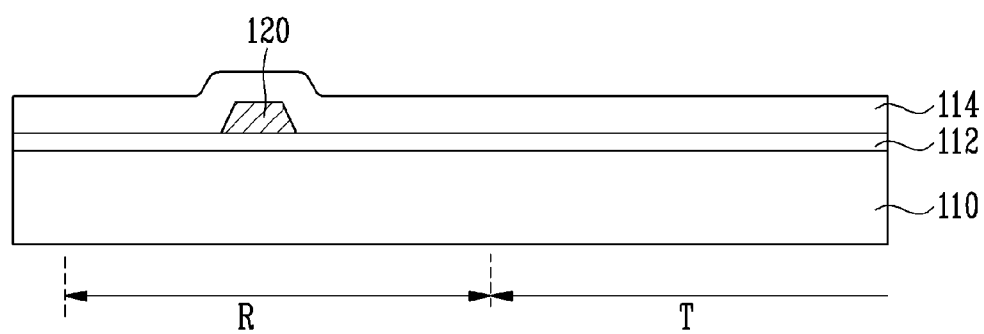

Referring to FIG. 2B, a gate insulating layer 114 is formed on the entire surface of the device substrate 110 having the gate electrode 120. The gate insulating layer 114 is formed of an inorganic insulating material such as a silicon nitride (SiNx) or silicon oxide (SiOx) into a single- or multiple-layer structure on an entire surface of the device substrate 110 having the gate electrode 120.

Figure 2C:
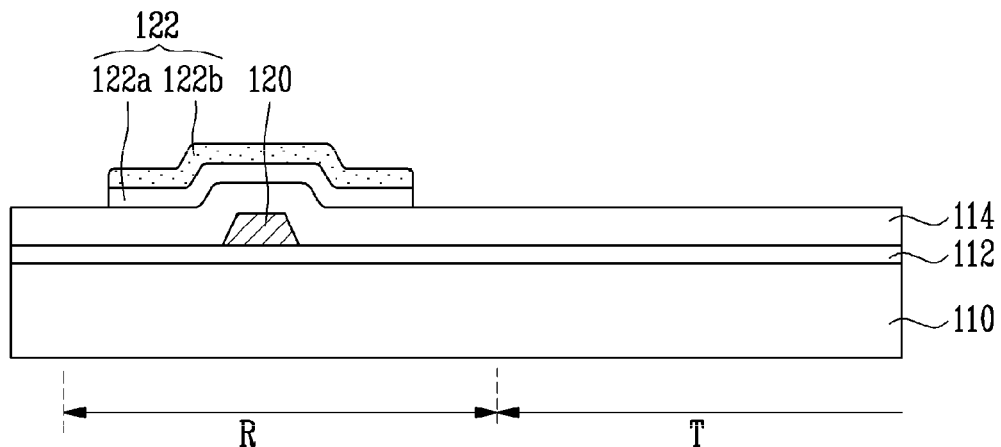

Referring to FIG. 2C, an active layer 122 is formed to overlap with the gate electrode 120 by forming an amorphous silicon layer and an n+ layer on the gate insulating layer 114 and then patterning the amorphous silicon layer and the n+ layer. The active layer 122 is formed in a stacked structure of a semiconductor layer 122a formed on the gate insulating layer 114 and an ohmic contact layer 122b formed on the semiconductor layer 122a. The ohmic contact layer 122b is formed by doping n+ impurity ions into the amorphous silicon layer.

Figure 2D:
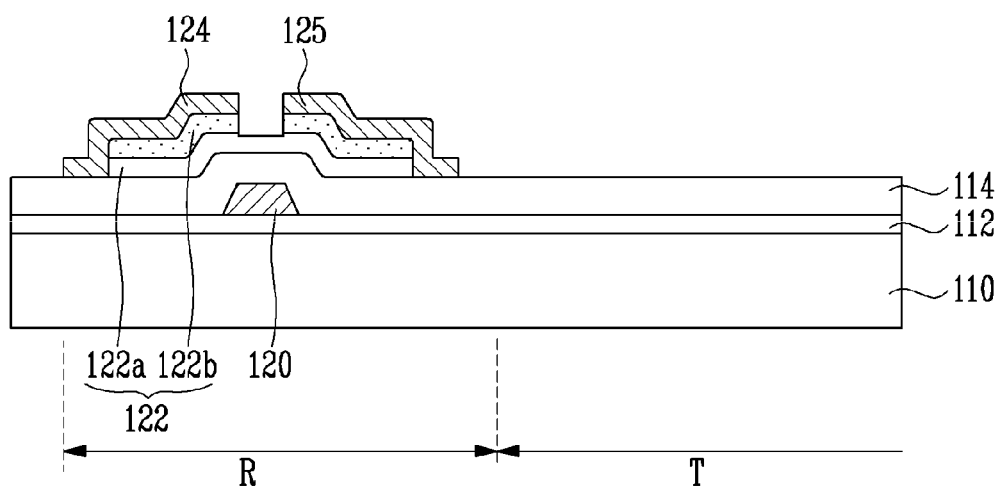

Referring to FIG. 2D, a second conductive material is formed on the device substrate 110 having the active layer 122. The second conductive material is then patterned through photolithography and etching processes to form a source electrode 124 and a drain electrode 125. At this time, the source and drain electrodes 124 and 125 are patterned to be spaced apart from each other with the gate electrode 120 interposed therebetween. The ohmic contact layer 122b is also patterned using the source and drain electrodes 124 and 125 as etching masks. Thus, the exposed ohmic contact layers 122b are spaced apart from each other with the gate electrode 120 interposed therebetween.

The second conductive material includes a single layer of a metallic material such as Mo, Ti, Cu, Ta, AlNd, Al, Cr, Mo alloy, Cu alloy or Al alloy. However, aspects of the present invention are not limited thereto. Thus, alternatively, the second conductive material constituting the source and drain electrodes 124 and 125 may include a stacked structure of two or more layers such as Al/Cr, Al/Mo, Al(Nd)/Al, Al(Nd)/Cr, Mo/Al(Nd)/Mo, Cu/Mo, Ti/Al(Nd)/Ti, Mo/Al, Mo/Ti/Al(Nd), Cu alloy/Mo, Cu alloy/Al, Cu alloy/Mo alloy, Cu alloy/Al alloy, Al/Mo alloy, Mo alloy/Al, Al alloy/Mo alloy, Mo alloy/Al alloy or Mo/Al alloy.

Figure 2E:
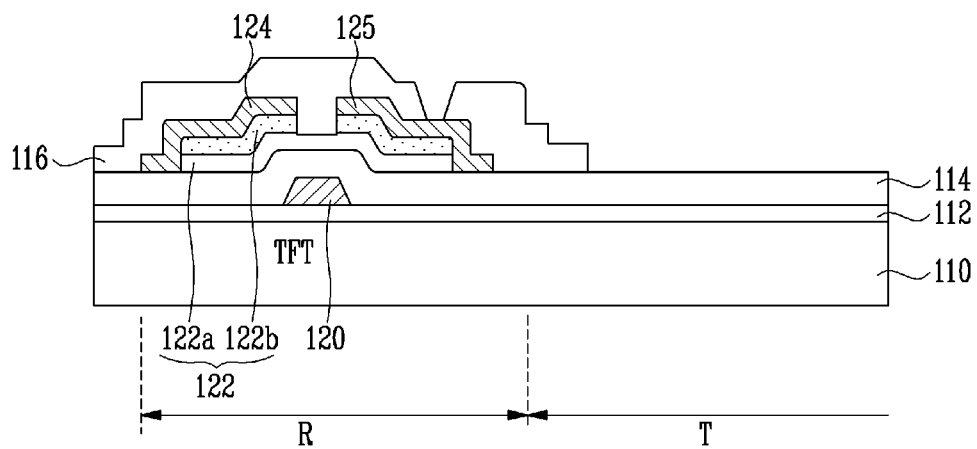

Referring to FIG. 2E, a passivation layer 116 is formed to cover a thin film transistor TFT formed on the reflection region R of the device substrate 110. Also, the passivation layer 116 exposes the drain electrode 125 of the thin film transistor TFT. The passivation layer 116 is formed by depositing an inorganic insulating material into a single- or multiple-layered structure on the entire surface of the device substrate 110 having the thin film transistor TFT, and then patterning the inorganic insulating material through photolithography and etching processes. The inorganic insulation material includes SiOx, SiNx, and SiONx. However, aspects of the present invention are not limited thereto, and the inorganic insulation layer may be formed of other suitable materials.

Figure 2F:
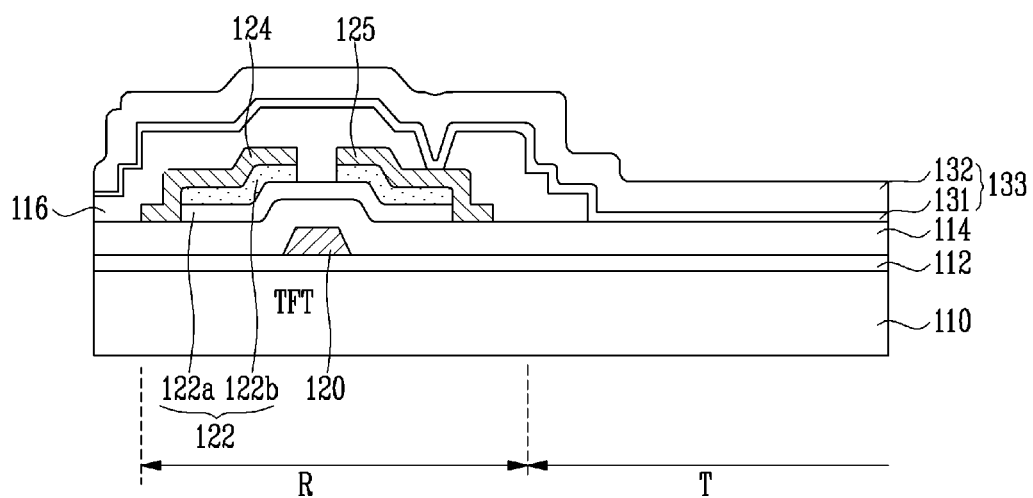

Referring to FIG. 2F, a pixel electrode 133 is formed to be electrically connected to the exposed drain electrode 125 through the passivation layer 116. The pixel electrode 133 is formed in a stacked structure having a first pixel electrode 131 contacting the drain electrode 125 and a second pixel electrode 132 formed on the first pixel electrode 131.

The first and second pixel electrodes 131 and 132 are formed of a transparent conductive material. The second pixel electrode 132 is formed of a transparent conductive material having a higher etch rate than an etch rate of the first pixel electrode 131. The second pixel electrode 132 is formed to be thicker than the first pixel electrode 131. ITO or IZO is used as the transparent conductive material of the first pixel electrode 131. ZnO or ZnO alloy is used as the transparent conductive material of the second pixel electrode 132. AlZnO is used as the ZnO alloy.

Figure 2G:
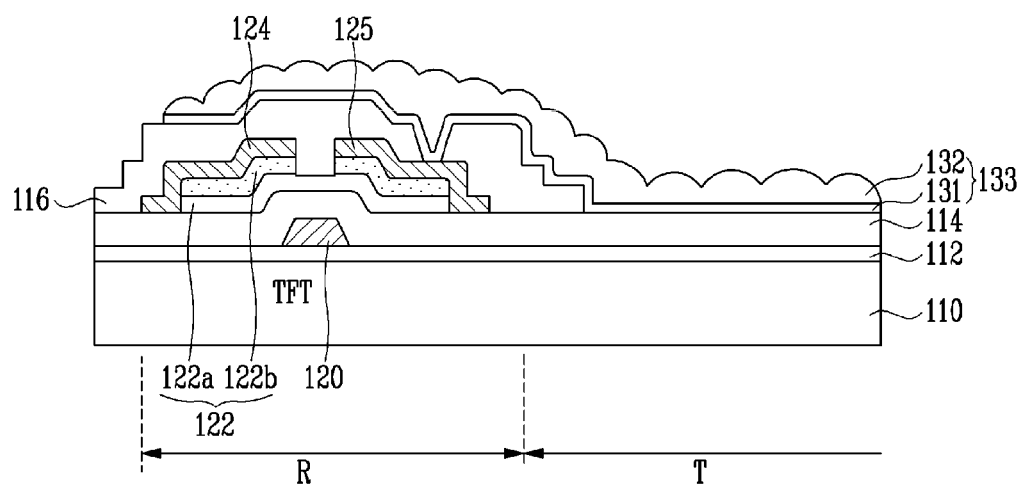

Referring to FIG. 2G, the second pixel electrode 132 is etched to have an embossed pattern, and the pixel electrode 133 is patterned to be positioned on the transmission region T and the reflection region R in a sub-pixel region of the device substrate 110. Specifically, the embossed pattern is first formed at the second pixel electrode 132 by performing a spray type etching process with respect to the stacked first and second pixel electrodes 131 and 132. A wet etching process is performed as the etching process. Diluted hydro-fluoride (HF), obtained by mixing HF and distilled water (DI) water at a ratio of 1:400, is used as an etchant in the wet etching process.

Although such an etching process is performed, the etch rate of the second pixel electrode 132 is greater than the etch rate of the first pixel electrode 131. Hence, there is no concern that the first pixel electrode 131 is exposed or that its lower layer is exposed due to a piercing of the first pixel electrode 131. Also, since the spray type etching process is performed as an etching process, a round embossed pattern can be formed at the second pixel electrode 132 without a separate mask. Subsequently, the pixel electrode 133 is positioned to be on the transmission and reflection regions T and R in the sub-pixel region of the device substrate 110. The pixel electrode 133 is positioned by patterning the first pixel electrode 131 and the second pixel electrode 132 having the embossed pattern.

As described above, according to the present embodiment, the second pixel electrode 132 is formed to have a round embossed pattern, so that the reflection of light can be increased as compared with a square embossed pattern. Particularly, when the ZnO alloy is used as the second pixel electrode 132, an amount of reflected external light can be increased by a metallic component of the ZnO alloy in the transmission region T.

According to the present embodiment, the second pixel electrode 132 having the embossed pattern is formed in the transmission region T, so that the diffusion of light from a backlight unit (not shown) disposed below the device substrate 110 is induced, thereby enhancing luminance of the transreflective LCD device.

Figure 2H:
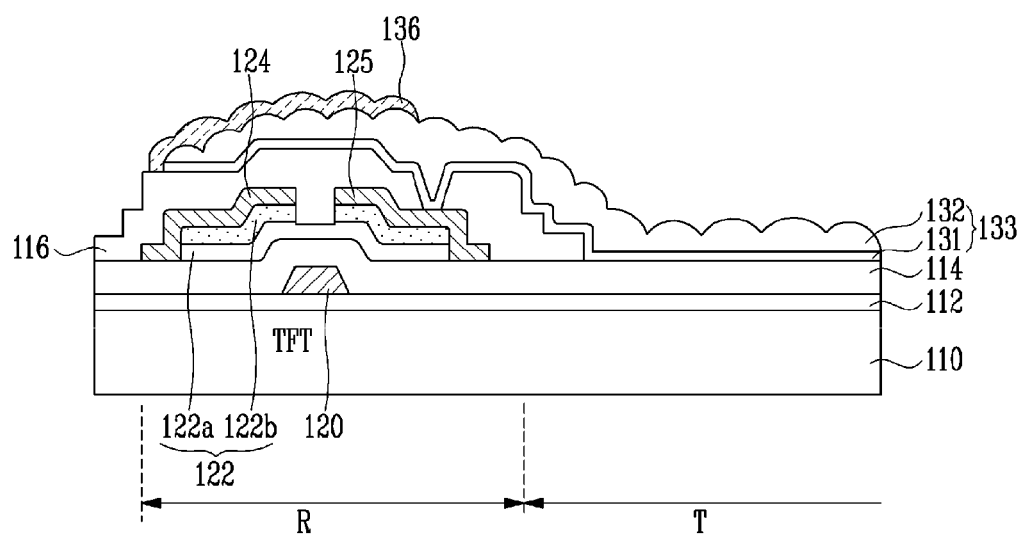

Referring to FIG. 2H, a reflective layer 136 is formed on the reflection region R of the device substrate 110 by forming an opaque conductive material on the second pixel electrode 132 having the embossed pattern and then patterning the opaque conductive material. A surface of the reflective layer 136 has round concave and convex portions, corresponding to a shape of the second pixel electrode 132. The reflective layer 136 has round concave and convex portions so that the reflection of light incident from the exterior can be increased as compared with a square embossed pattern, thereby enhancing luminance. The opaque conductive material constituting the reflective layer 136 includes at least one of Ag, Al, Au and alloy thereof.

When a reflective layer is formed on an insulating layer made of an organic insulating material, the adhesion between the organic insulating layer and the reflective layer is deteriorated, and therefore, the reflective layer is exfoliated. However, in the present embodiment, the reflective layer 136 is formed on the second pixel electrode 132 made of a conductive material. As a result, adhesion between the reflective layer 136 and the second pixel electrode 132 is improved. Thus, it is possible to prevent the reflective layer 136 from being exfoliated, thereby enhancing a reliability of the thin film transistor substrate.

Moreover, in the present embodiment of the present invention, since a formation of an organic insulating layer is omitted, and the second pixel electrode is subjected to an embossing process, the stacking, photolithography and masking processes of the organic insulating layer are not performed. Thus, in the method of manufacturing the transflective LCD having the thin film transistor, according to aspects of the present invention, manufacturing cost can be reduced, and manufacturing processes are simplified, thereby enhancing productivity.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A transflective liquid crystal display (LCD) device having a thin film transistor, comprising:
   a device substrate having a reflection region and a transmission region;
   the thin film transistor formed on the reflection region of the device substrate and having a drain electrode;
   a passivation layer formed on the thin film transistor and exposing the drain electrode;
   a pixel electrode formed in a stacked structure comprising:
      a first pixel electrode electrically connected to the drain electrode; and
      a second pixel electrode formed to have an embossed pattern on the first pixel electrode; and
   a reflective layer formed on the second pixel electrode and formed in the reflection region of the device substrate,
   wherein the second pixel electrode is formed of a transparent conductive material, and
   wherein an etch rate of the second pixel electrode is higher than an etch rate of the first pixel electrode.

2. The transflective LCD device according to claim 1, wherein the first pixel electrode is formed of indium tin oxide (ITO), tin oxide (TO) or indium zinc oxide (IZO), and
   wherein the second pixel electrode is formed of zinc oxide (ZnO) or ZnO alloy.

3. The transflective LCD device according to claim 1, wherein the embossed pattern is formed on the reflection region and the transmission region of the device substrate.

4. The transflective LCD device according to claim 1, wherein the embossed pattern has a round shape.

5. The transflective LCD device according to claim 1, wherein a surface of the reflective layer has round concave and convex portions corresponding to a lower part of the embossed pattern.

6. The transflective LCD device according to claim 1, wherein the reflective layer is formed of an opaque conductive material.

7. A transflective liquid crystal display (LCD) device having a thin film transistor, comprising:
   a device substrate having a reflection region and a transmission region;
   the thin film transistor formed on the reflection region of the device substrate and having a drain electrode;
   a passivation layer formed on the thin film transistor and exposing the drain electrode;
   a pixel electrode formed in a stacked structure comprising:
      a first pixel electrode electrically connected to the drain electrode; and
      a second pixel electrode formed to have an embossed pattern on the first pixel electrode; and
   a reflective layer formed on the second pixel electrode and formed in the reflection region of the device substrate,
   wherein a thickness of the second pixel electrode is greater than a thickness of the first pixel electrode.

8. A transflective liquid crystal display (LCD) device having a thin film transistor, comprising:
   a device substrate having a reflection region and a transmission region;

the thin film transistor formed on the reflection region of the device substrate and having a drain electrode;

a passivation layer formed on the thin film transistor and exposing the drain electrode; and a pixel electrode formed on the device substrate having the passivation layer formed on the thin film transistor, wherein the pixel electrode comprises a first pixel electrode electrically connected to the drain electrode and a second pixel electrode formed to have an embossed pattern on the first pixel electrode, wherein the second pixel electrode is formed of a transparent conductive material, and wherein an etch rate of the second pixel electrode is higher than an etch rate of the first pixel electrode.

* * * * *